(12) United States Patent
Sakuma

(10) Patent No.: US 12,000,857 B2
(45) Date of Patent: Jun. 4, 2024

(54) SENSOR MODULE HAVING CONDUCTIVE BONDING MEMBERS WITH VARYING MELTING POINTS AND YOUNG'S MODULI

(71) Applicant: SEIKO EPSON CORPORATION, Tokyo (JP)

(72) Inventor: Masayasu Sakuma, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/677,234

(22) Filed: Feb. 22, 2022

(65) Prior Publication Data

US 2022/0268806 A1 Aug. 25, 2022

(30) Foreign Application Priority Data

Feb. 25, 2021 (JP) ................................. 2021-028264

(51) Int. Cl.
| | |
|---|---|
| *G01P 15/08* | (2006.01) |
| *B81B 7/00* | (2006.01) |
| *G01P 1/02* | (2006.01) |
| *G01P 3/00* | (2006.01) |
| *G01P 15/18* | (2013.01) |

(52) U.S. Cl.
CPC .............. *G01P 15/08* (2013.01); *B81B 7/007* (2013.01); *G01P 1/023* (2013.01); *G01P 3/00* (2013.01); *G01P 15/0802* (2013.01); *G01P 15/18* (2013.01); *B81B 2201/0228* (2013.01); *B81B 2207/012* (2013.01)

(58) Field of Classification Search
CPC ...... G01P 15/08; G01P 15/18; G01P 15/0802; G01P 1/02; G01P 1/023
See application file for complete search history.

(56) References Cited

U.S. PATENT DOCUMENTS

| | | | | |
|---|---|---|---|---|
| 6,100,108 | A * | 8/2000 | Mizuno | G01P 1/023 438/126 |
| 6,515,370 | B2 * | 2/2003 | Hashimoto | H01L 23/525 257/784 |
| 6,617,194 | B2 * | 9/2003 | Shimoe | H01L 23/50 257/E23.079 |
| 6,838,765 | B2 * | 1/2005 | Hyodo | H01L 23/62 257/E23.19 |
| 8,426,930 | B2 * | 4/2013 | Holzmann | G01P 15/0802 257/E23.125 |

(Continued)

FOREIGN PATENT DOCUMENTS

| | | |
|---|---|---|
| JP | 10-242633 | 9/1998 |
| JP | 2013-073945 | 4/2013 |

(Continued)

*Primary Examiner* — Helen C Kwok
(74) *Attorney, Agent, or Firm* — Rankin, Hill & Clark LLP

(57) ABSTRACT

A sensor module includes: a substrate including a first terminal and a second terminal; a first conductive bonding member having a first melting point and a first Young's modulus; a lead bonded to the first terminal by the first conductive bonding member; a second conductive bonding member having a second melting point lower than the first melting point and a second Young's modulus higher than the first Young's modulus; and an inertial sensor bonded to the second terminal by the second conductive bonding member.

7 Claims, 13 Drawing Sheets

(56) References Cited

U.S. PATENT DOCUMENTS

| | | | | |
|---|---|---|---|---|
| 2002/0066583 A1* | 6/2002 | Soga | ................... | B23K 35/262 |
| | | | | 174/50.56 |
| 2006/0145352 A1* | 7/2006 | Soga | ..................... | H01L 24/03 |
| | | | | 257/772 |
| 2008/0251866 A1* | 10/2008 | Belt | ...................... | H01L 24/32 |
| | | | | 257/417 |
| 2012/0256307 A1* | 10/2012 | Koyama | ............ | H01L 23/3192 |
| | | | | 257/E23.18 |
| 2015/0344296 A1 | 12/2015 | Pahl | | |
| 2020/0115224 A1* | 4/2020 | Duqi | .................... | B81B 3/0018 |
| 2020/0254704 A1 | 8/2020 | Kazuno et al. | | |
| 2021/0123943 A1 | 4/2021 | Sakuma | | |

FOREIGN PATENT DOCUMENTS

| | | |
|---|---|---|
| JP | 2013-149876 | 8/2013 |
| JP | 2016-508075 | 3/2016 |
| JP | 2020-136324 | 8/2020 |
| JP | 2021-067625 | 4/2021 |

\* cited by examiner

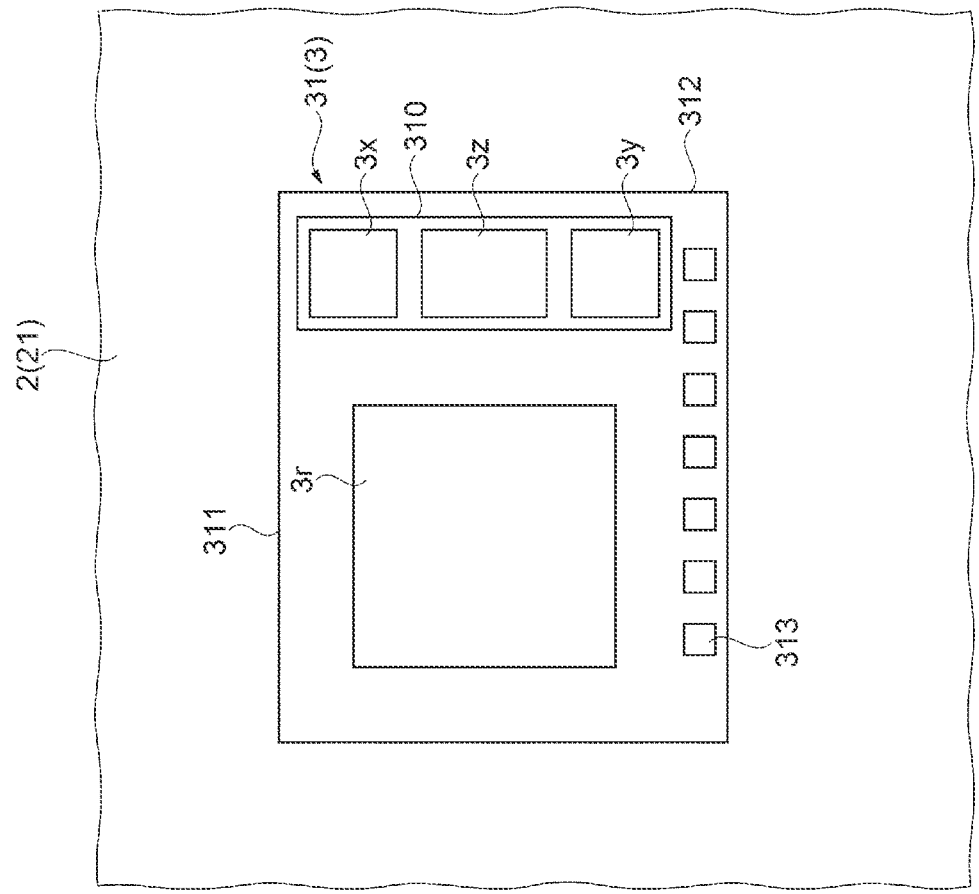
FIG. 4
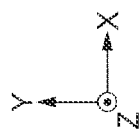

FIG. 10
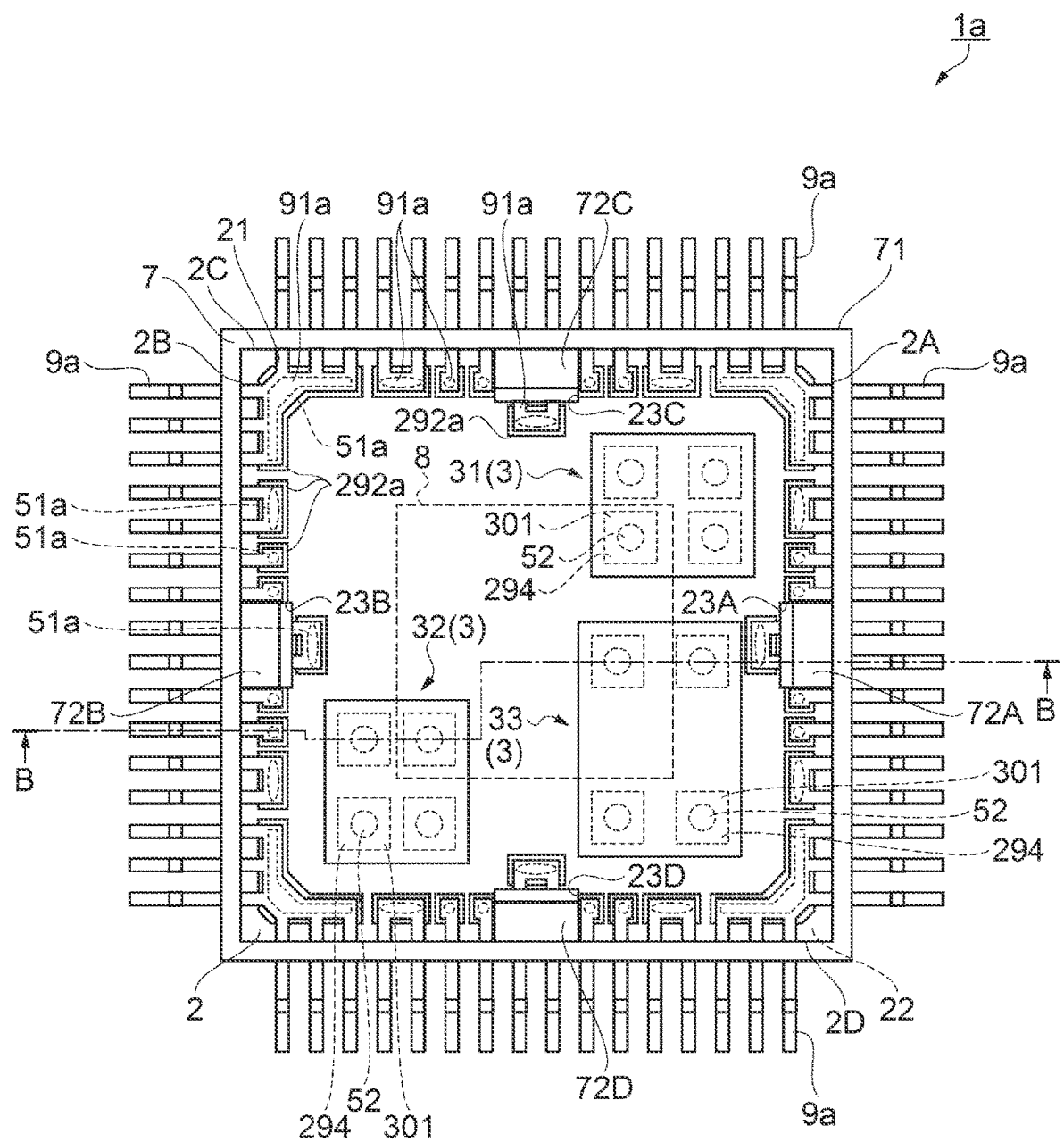
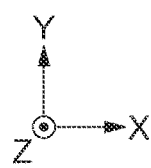

SENSOR MODULE HAVING CONDUCTIVE BONDING MEMBERS WITH VARYING MELTING POINTS AND YOUNG'S MODULI

The present application is based on, and claims priority from JP Application Serial Number 2021-028264, filed Feb. 25, 2021, the disclosure of which is hereby incorporated by reference herein in its entirety.

BACKGROUND

1. Technical Field

The present disclosure relates to a sensor module.

2. Related Art

In related art, as described in JP-A-10-242633, it is known that when an electronic device is manufactured by soldering and fixing, to a substrate, an electronic component such as a piezoelectric element in which a piezoelectric element piece is fixed in an airtight package, a solder having a high melting temperature is used in a previous operation of soldering and fixing, and a solder having a low melting temperature is used in a subsequent operation of soldering and fixing, so that the subsequent soldering does not affect the previous soldering due to different melting temperatures of solders.

Unfortunately, in the electronic device described in JP-A-10-242633, as a solder material having a lower melting temperature, for example, a Sn—Bi eutectic solder is used, which has low mechanical strength and thermal fatigue resistance and is not sufficient in reliability as a solder for the electronic device. For this reason, when the solders in the electronic device described in JP-A-10-242633 are selectively used and applied to, for example, a sensor module in which an inertial sensor such as an acceleration sensor or an angular velocity sensor is mounted at a substrate, there is a problem that in an environment for using the sensor module, a stress caused by a difference in thermal expansion coefficients of the inertial sensor and the substrate is repeatedly applied to the solder as a bonding portion between the inertial sensor and the substrate, and thus the solder deteriorates and the sensor module becomes unstable in function and decreased in reliability.

SUMMARY

A sensor module includes: a substrate, including a first surface and a second surface on front and back sides of each other, a first terminal provided at one of the first surface and the second surface, and a second terminal provided at the first surface; a lead bonded to the first terminal; a first conductive bonding member having a first melting point and a first Young's modulus, and bonding the lead and the first terminal; an inertial sensor bonded to the second terminal; and a second conductive bonding member having a second melting point lower than the first melting point and a second Young's modulus higher than the first Young's modulus, and bonding the inertial sensor and the second terminal.

BRIEF DESCRIPTION OF THE DRAWINGS

FIG. 4 is a plan view illustrating a portion E in FIG. 1.

FIG. 10 is a plan view of a sensor module according to a second embodiment.

DESCRIPTION OF EXEMPLARY EMBODIMENTS

1. First Embodiment

Figure 1:
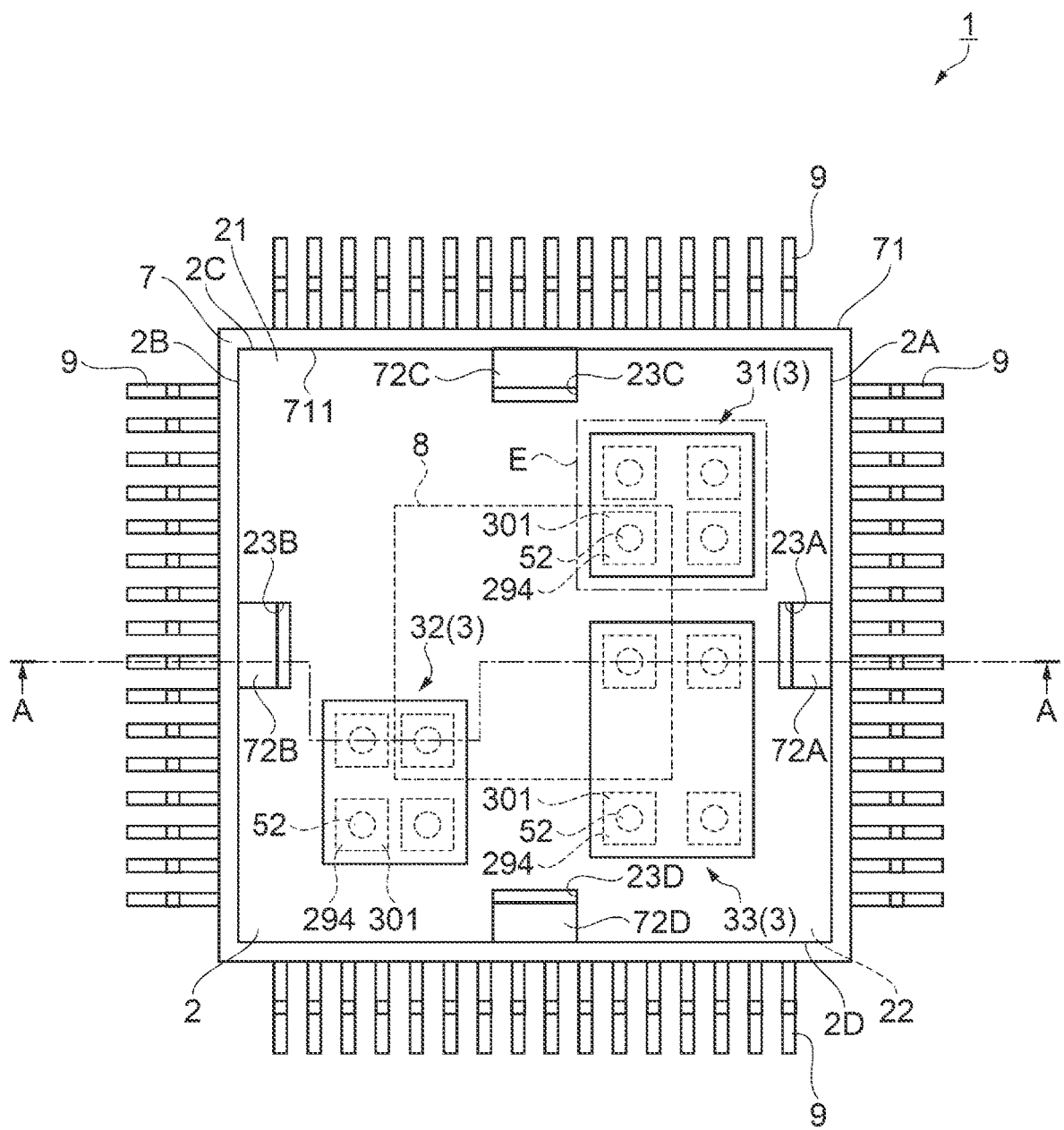
FIG. 1 is a plan view of a sensor module according to a first embodiment.

A sensor module 1 according to the first embodiment will be described with reference to FIGS. 1 to 4. FIG. 1 illustrates a state in which a top plate 70 of a cap 7 is removed for convenience of describing an internal configuration of the sensor module 1. In FIG. 4, for convenience of describing an internal configuration of a first inertial sensor 31, components other than an acceleration sensor element 310, an angular velocity sensor element 3r, and internal electrodes 313 are omitted. Dimensional ratios of each component in each drawing are different from actual dimension ratios.

As to coordinates illustrated in the drawings, three axes orthogonal to each other are referred to as an X axis, a Y axis, and a Z axis. A direction along the X axis is defined as an "X direction", a direction along the Y axis is defined as a "Y direction", and a direction along the Z axis is defined as a "Z direction", in each of which a direction indicated by an arrow is a plus direction. In addition, the plus direction in the Z direction is referred to as "up" or "upper", and a minus direction in the Z direction is referred to as "down" or "lower". Further, when viewed from a top in the Z direction, a surface at a plus side in the Z direction is referred to as an upper surface, and a surface at a minus side in the Z direction opposite to the upper surface is referred to as a lower surface.

Figure 2:
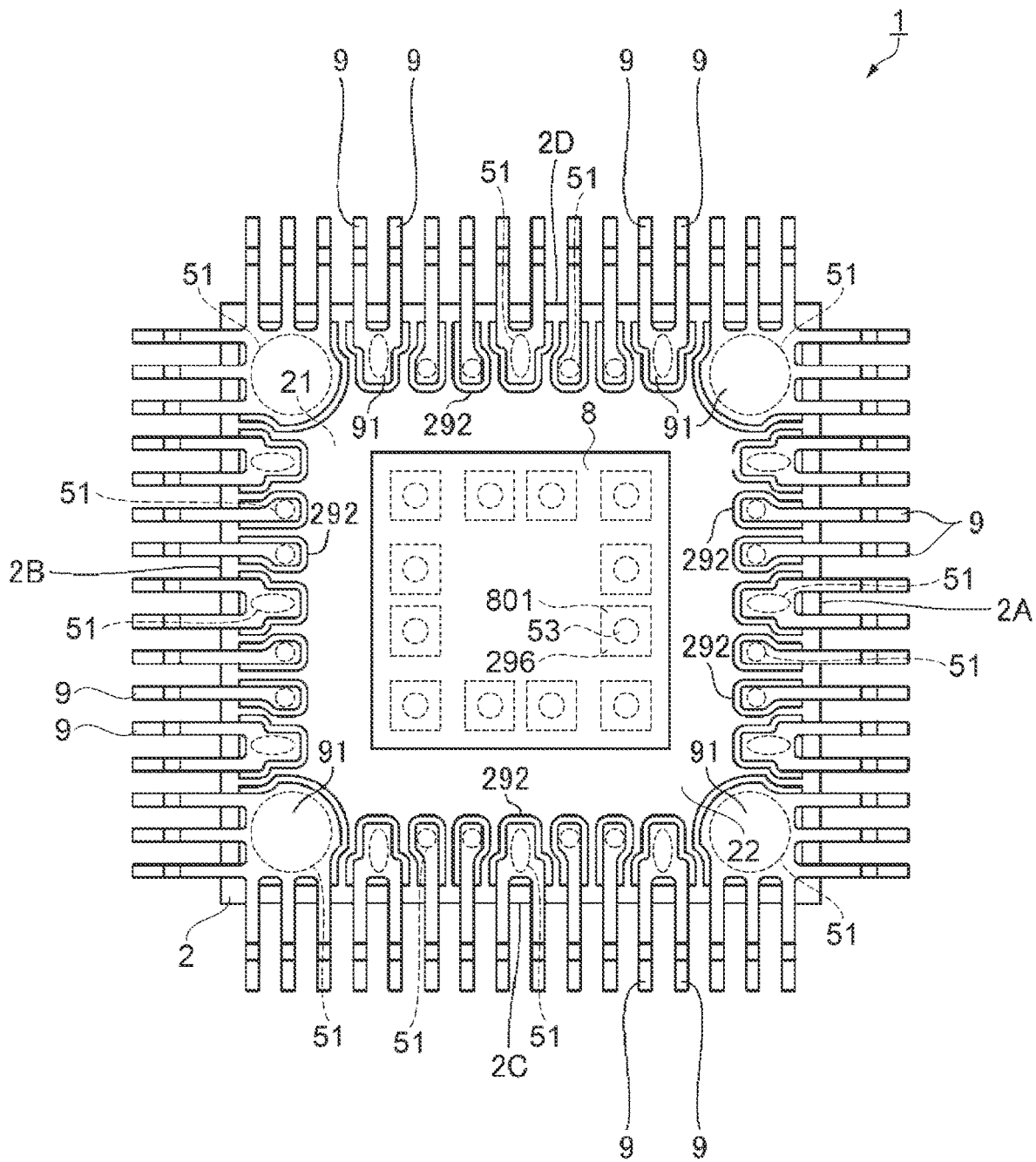
FIG. 2 is a bottom view of the sensor module according to the first embodiment.
Figure 3:
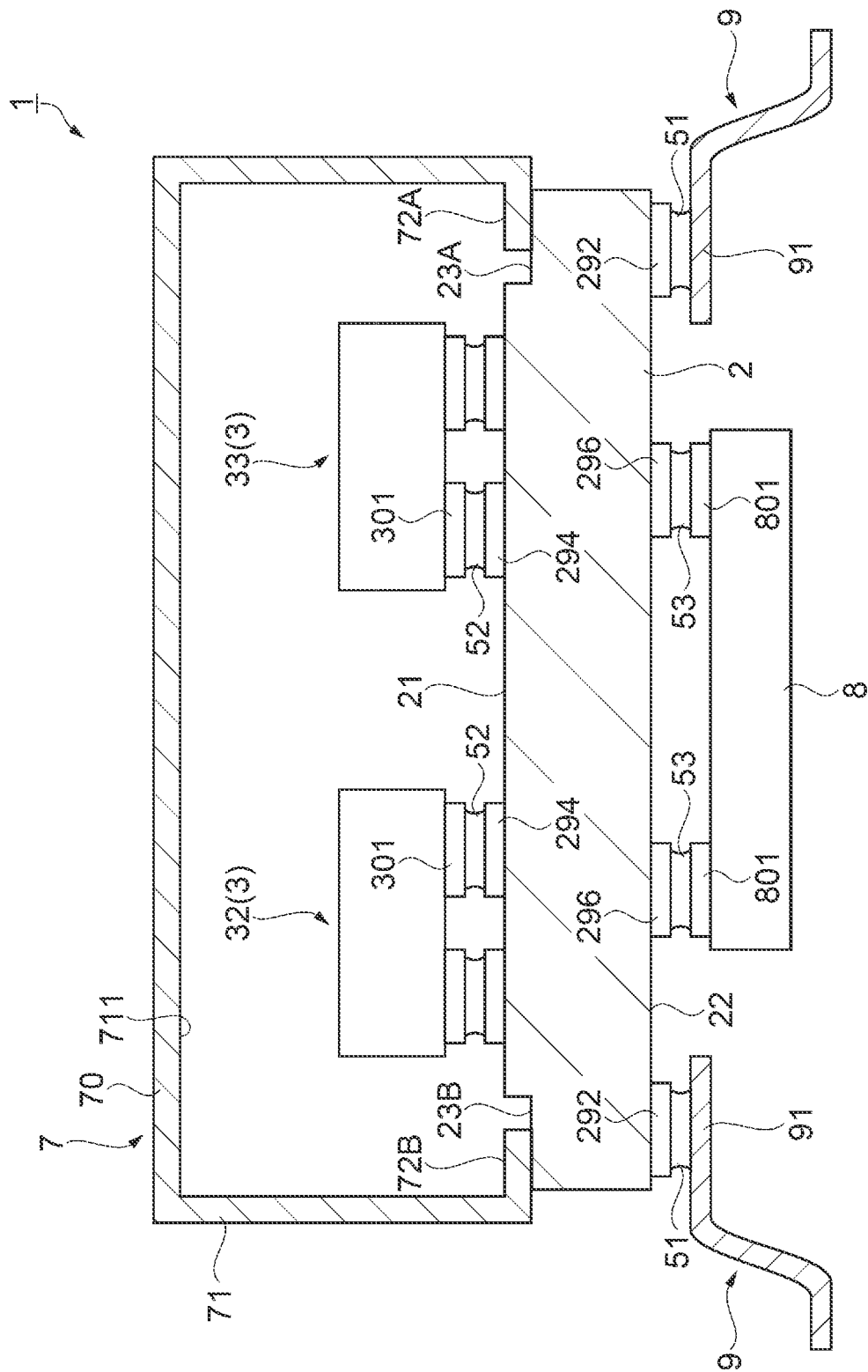
FIG. 3 is a cross-sectional view taken along a line A-A in FIG. 1.

As shown in FIGS. 1 to 3, the sensor module 1 includes: a substrate 2; the cap 7 bonded to a first surface 21 of the substrate 2; an inertial sensor 3 bonded to the first surface 21; a lead 9 bonded to a second surface 22 of the substrate 2, the second surface 22 and the first surface 21 being on front and back sides of each other; and a circuit element 8 bonded to the second surface 22. In the present embodiment, the first surface 21 of the substrate 2 is an upper surface of the substrate 2, and the second surface 22 is a lower surface of the substrate 2.

First terminals 292 as external coupling terminals of the sensor module 1, and third terminals 296 as internal coupling terminals of the sensor module 1 are provided at the second surface 22 of the substrate 2. The first terminals 292 are bonded to the lead 9 via first conductive bonding members 51. In the present embodiment, the first terminals 292 are provided at the second surface 22, but may also be provided at the first surface 21. In other words, the first terminals 292 may be provided at one of the first surface 21 and the second surface 22.

Each third terminal 296 is bonded to the circuit element 8 via a third conductive bonding member 53.

The first surface 21 of the substrate 2 is provided with second terminals 294 as internal coupling terminals of the sensor module 1. Each second terminal 294 is bonded to the inertial sensor 3 via a second conductive bonding member 52.

First, the substrate 2 will be described.

As shown in FIGS. 1 and 2, the substrate 2 is a printed circuit board. In the present embodiment, the substrate 2 has a rectangular plate-like shape when viewed from the top in the Z direction orthogonal to the first surface 21. The substrate 2 may be, for example, a ceramic substrate, a glass epoxy substrate, or the like. For convenience of description, wiring formed at the substrate 2 is not illustrated, while only the second terminals 294 provided at the first surface 21, and the first terminals 292 and the third terminals 296 provided at the second surface 22 are illustrated. The first terminals 292, the second terminals 294, and the third terminals 296 are electrically coupled to the wiring (not shown) formed at the substrate 2.

When viewed from the top in the Z direction, the substrate 2 includes a first side 2A, a second side 2B facing the first side 2A, a third side 2C adjacent to the first side 2A and the second side 2B, and a fourth side 2D facing the third side 2C.

In the first surface 21 of the substrate 2, a first concave portion 23A is provided at the first side 2A, a second concave portion 23B is provided at the second side 2B, a third concave portion 23C is provided at the third side 2C, and a fourth concave portion 23D is provided at the fourth side 2D.

Next, each portion located at a first surface 21 side of the substrate 2 will be described.

As shown in FIGS. 1 and 3, the inertial sensor 3 is bonded to the first surface 21 of the substrate 2. By bonding the cap 7 to the first surface 21, the inertial sensor 3 is accommodated between the first surface 21 and the cap 7.

When viewed from the top in the Z direction, the cap 7 has a rectangular shape substantially similar to the substrate 2. The cap 7 may be formed of, for example, alloy 42, which is an iron-nickel alloy.

The cap 7 includes the top plate 70, a side wall 71 extending downward from an outer peripheral edge of the top plate 70, a concave portion 711 formed by the top plate 70 and the side wall 71, and a first convex portion 72A, a second convex portion 72B, a third convex portion 72C, and a fourth convex portion 72D protruding inward from a lower end portion of the side wall 71.

When viewed from the top in the Z direction, the convex portions 72A, 72B, 72C, and 72D of the cap 7 respectively overlap the concave portions 23A, 23B, 23C, and 23D of the substrate 2.

The first convex portion 72A of the cap 7 is bonded to the first concave portion 23A of the substrate 2 via a bonding member (not shown). Similarly, the second convex portion 72B, the third convex portion 72C, and the fourth convex portion 72D of the cap 7 are respectively bonded to the second concave portion 23B, the third concave portion 23C, and the fourth concave portion 23D of the substrate 2 via bonding members (not shown).

The cap 7 is bonded to the first surface 21 of the substrate 2, so that the inertial sensor 3 is accommodated in the concave portion 711.

The inertial sensor 3 includes the first inertial sensor 31, a second inertial sensor 32, and an angular velocity sensor 33.

The first inertial sensor 31 and the second inertial sensor 32 are so-called six-axis inertial sensors, which detect angular velocities around three axes including the X axis, the Y axis, and the Z axis and accelerations in directions along the three axes. The angular velocity sensor 33 is provided to accurately detect an angular velocity around a desired detection axis among the three axes including the X axis, the Y axis, and the Z axis. In the present embodiment, the angular velocity sensor 33 detects the angular velocity around the Z axis. The inertial sensor 3 is not limited to such a configuration, and may be a sensor that detects at least one of an acceleration in a direction along each axis or an angular velocity around each axis.

The inertial sensor 3 includes coupling terminals 301 at a lower surface of the inertial sensor 3. The coupling terminals 301 are used to input a control signal for controlling the inertial sensor 3 to the inertial sensor 3, and to output a detection signal such as the acceleration or the angular velocity detected by the inertial sensor 3 from the inertial sensor 3.

The coupling terminals 301 are bonded to the second terminals 294 provided at the first surface 21 of the substrate 2 via the second conductive bonding members 52, so that the coupling terminals 301 are electrically coupled to the second terminals 294, and the inertial sensor 3 is fixed to the first surface 21 of the substrate 2.

In the present embodiment, the second conductive bonding member 52 is a lead-free solder, and a symbol indicating a composition thereof is Sn-3.0Ag-0.8Cu-3.0Bi-0.02Ni. The symbols indicating the composition are expressed according to the Japanese Industrial Standard Z3282:2017. Specifically, the symbols indicating the composition show element symbols of the elements mainly forming the lead-free solder and weight ratios of the elements. For example, Sn-3.0Ag-0.8Cu-3.0Bi-0.02Ni omits indication showing a weight ratio of tin (Sn) as balance, and indicates the weight ratios of the elements other than tin (Sn), specifically indicating that 3.0% of silver (Ag), 0.8% of copper (Cu), 3.0% of bismuth (Bi), and 0.02% of nickel (Ni) are contained.

Sn-3.0Ag-0.8Cu-3.0Bi-0.02Ni used as the second conductive bonding member 52 has a melting point of 205° C. and a Young's modulus of 52.2 GPa. In other words, when Sn-3.0Ag-0.8Cu-3.0Bi-0.02Ni is used as the second conductive bonding member 52, a second melting point as the melting point of the second conductive bonding member 52 is 205° C., and a second Young's modulus as the Young's modulus of the second conductive bonding member 52 is 52.2 GPa.

Unlike a eutectic solder such as Sn—Bi and Sn—In, an alloy-based lead-free solder such as Sn-3.0Ag-0.8Cu-3.0Bi-0.02Ni is in a state in which a solid phase and a liquid phase coexist. Therefore, two temperatures including a solidus temperature and a liquidus temperature are defined as temperatures indicating a melting state of the solder, and the melting point in the present disclosure is the solidus temperature. The Young's modulus is a measured value at 25° C.

Here, the first inertial sensor 31 and the second inertial sensor 32 in the present embodiment will be described.

As illustrated in FIG. 4, when viewed from the top in the Z direction, the first inertial sensor 31 has a rectangular shape enclosed by long sides 311 and short sides 312 having a length different from that of the long sides 311. In the present embodiment, the long sides 311 are parallel to the X direction, and the short sides 312 are parallel to the Y direction.

The first inertial sensor 31 includes the acceleration sensor element 310, the angular velocity sensor element 3r, and plural internal electrodes 313 electrically coupled to the acceleration sensor element 310 and the angular velocity sensor element 3r by wiring (not shown).

The acceleration sensor element 310 and the angular velocity sensor element 3r are disposed side by side in the X direction along the long sides 311.

The acceleration sensor element 310 includes an X-axis acceleration sensor element 3x that detects the acceleration in the X direction along the long sides 311, a Z-axis acceleration sensor element 3z that detects the acceleration in the Z direction perpendicular to a plane including the long sides 311 and the short sides 312, and a Y-axis acceleration sensor element 3y that detects the acceleration in the Y direction along the short sides 312.

The X-axis acceleration sensor element 3x, the Z-axis acceleration sensor element 3z, and the Y-axis acceleration sensor element 3y are disposed side by side in this order from a plus side in the Y direction toward a minus side in the Y direction along the short side 312. However, arrangement of the X-axis acceleration sensor element 3x, the Z-axis acceleration sensor element 3z, and the Y-axis acceleration sensor element 3y is not limited thereto. For example, the X-axis acceleration sensor element 3x, the Z-axis acceleration sensor element 3z, and the Y-axis acceleration sensor element 3y may be disposed side by side in the X direction along the long sides 311.

The angular velocity sensor element 3r is a three-axis angular velocity sensor element for detecting angular velocities around the X axis, the Y axis, and the Z axis.

The plural internal electrodes 313 are disposed side by side in the X direction along the long sides 311. The acceleration sensor element 310 and the plural internal electrodes 313 are disposed side by side in the Y direction along the short sides 312.

The second inertial sensor 32 is the same as the first inertial sensor 31 except that the second inertial sensor 32 is mounted at the substrate 2 in a posture rotated counterclockwise by 90 degrees with respect to the first inertial sensor 31 when viewed from the top in the Z direction, and thus description thereof will be omitted.

Each portion located at the first surface 21 side of the substrate 2 has been described above. Next, each portion located at a second surface 22 side of the substrate 2 will be described.

As shown in FIGS. 2 and 3, the first terminals 292 as the external coupling terminals of the sensor module 1, and the third terminals 296 as the internal coupling terminals of the sensor module 1 are provided at the second surface 22 of the substrate 2. The first terminals 292 are bonded to the lead 9 via the first conductive bonding members 51. The third terminals 296 are bonded to the circuit element 8 via the third conductive bonding members 53.

The lead 9 is formed by, for example, cutting a lead frame during manufacturing, and is formed of, for example, an iron-based material or a copper-based material.

The lead 9 includes coupling portions 91 bonded to the first terminals 292 via the first conductive bonding members 51, so that the first terminals 292 are electrically coupled to the lead 9, and the lead 9 is fixed to the substrate 2.

In the present embodiment, the first conductive bonding member 51 is a lead-free solder, and a symbol indicating a composition thereof is Sn-5.0Sb. Sn-5.0Sb indicates that 5.0% of antimony (Sb) is contained with respect to elements other than tin (Sn).

Sn-5.0Sb used as the first conductive bonding member 51 has a melting point of 240° C. and a Young's modulus of 45.4 GPa. In other words, when Sn-5.0Sb is used as the first conductive bonding member 51, the first melting point as the melting point of the first conductive bonding member 51 is 240° C., and the first Young's modulus as the Young's modulus of the first conductive bonding member 51 is 45.4 GPa.

As described above, in the present embodiment, the second melting point as the melting point of the second conductive bonding member 52 is 205° C., and the second Young's modulus as the Young's modulus of the second conductive bonding member 52 is 52.2 GPa. That is, the second conductive bonding member 52 has a second melting point of 205° C. lower than the first melting point of 240° C. of the first conductive bonding member 51, and has a second Young's modulus of 52.2 GPa higher than the first Young's modulus of 45.4 GPa of the first conductive bonding member 51.

In this manner, by setting the second Young's modulus of the second conductive bonding member 52 to be higher than the first Young's modulus of the first conductive bonding member 51, deterioration of the second conductive bonding member 52 can be prevented even when a stress caused by a difference in thermal expansion coefficients of the inertial sensor 3 and the substrate 2 is repeatedly applied to the second conductive bonding member 52 as a bonding portion between the inertial sensor 3 and the substrate 2. Specifically, cracks are less likely to occur in the second conductive bonding member 52, and generated cracks are less likely to expand. Therefore, the inertial sensor 3 can be guaranteed to be electrically coupled to the substrate 2 for a long period of time, so that the sensor module 1 can be stable in function and enhanced in reliability.

In the present embodiment, although Sn-5.0Sb is used as the first conductive bonding member 51, the present disclosure is not limited thereto, and a solder other than Sn-5.0Sb may be used. As the solder other than Sn-5.0Sb, for example, Sn-10.0Sb or the like can be used as the first conductive bonding member 51. Sn-10.0Sb has a melting point of 245° C. and a Young's modulus of 47.9 GPa. The solder used as the first conductive bonding member 51 may be a solder having a melting point of 230° C. or more. Further, in the present embodiment, the lead-free solder is used as the first conductive bonding member 51, but a lead-containing solder may also be used.

In addition, by using a high-temperature solder such as Sn-5.0Sb as the first conductive bonding member 51, remelting of the first conductive bonding member 51 can be prevented when a customer is to solder the lead 9 to a customer substrate to mount the sensor module 1 at the customer substrate. The sensor module 1 is calibrated before delivery to the customer to correct deviation of the detection axis of the inertial sensor 3, or the like, but when the first conductive bonding member 51 is remelted when the customer mounts the sensor module 1 at the customer substrate, a bonding state between the lead 9 and the substrate 2 changes. That is, the deviation of the detection axis of the inertial sensor 3, or the like changes from a state before delivery, and detection accuracy of the sensor module 1 decreases. However, a decrease in the detection accuracy of the sensor module 1 can be prevented by preventing the remelting of the first conductive bonding member 51.

As shown in FIGS. 2 and 3, the second surface 22 of the substrate 2 is provided with the third terminals 296. The third terminals 296 are bonded to the circuit element 8 via the third conductive bonding members 53.

The circuit element 8 may be obtained by, for example, molding a bare chip as a semiconductor chip. The circuit element 8 controls driving of the inertial sensor 3 and processes the detection signal output from the inertial sensor 3. Specifically, the circuit element 8 performs various processing on the detection signal output from the inertial sensor 3, such as sampling, zero point correction, sensitivity adjustment, filtering, temperature correction, and detection signal synthesis, and outputs a processed detection signal.

Coupling terminals 801 are provided at an upper surface of the circuit element 8, that is, a surface of the circuit element 8 facing the third terminals 296. The coupling terminals 801 are bonded to the third terminals 296 via the third conductive bonding members 53.

The coupling terminal 801 is used to input the detection signal such as the acceleration or the angular velocity detected by the inertial sensor 3 to the circuit element 8, and to output the control signal for controlling the inertial sensor 3 and the processed detection signal obtained by processing the detection signal input from the inertial sensor by the circuit element 8, etc. from the circuit element 8.

The coupling terminals 801 are bonded to the third terminals 296 provided at the second surface 22 of the substrate 2 via the third conductive bonding members 53, so that the coupling terminal 801 are electrically coupled to the third terminals 296, and the circuit element 8 is fixed to the second surface 22 of the substrate 2.

In the present embodiment, the third conductive bonding member 53 is formed of a lead-free solder having the same composition as that of the second conductive bonding member 52. Specifically, Sn-3.0Ag-0.8Cu-3.0Bi-0.02Ni is used as the third conductive bonding member 53, and has a third melting point of 205° C. as a melting point of the third conductive bonding member 53, and a third Young's modulus of 52.2 GPa as a Young's modulus of the third conductive bonding member 53.

As described above, in the present embodiment, the first melting point as the melting point of the first conductive bonding member 51 is 240° C., and the first Young's modulus as the Young's modulus of the first conductive bonding member 51 is 45.4 GPa. That is, the third conductive bonding member 53 has a second melting point of 205° C. lower than the first melting point of 240° C. of the first conductive bonding member 51, and has a third Young's modulus of 52.2 GPa higher than the first Young's modulus of 45.4 GPa of the first conductive bonding member 51.

In this manner, by setting the third Young's modulus of the third conductive bonding member 53 to be higher than the first Young's modulus of the first conductive bonding member 51, deterioration of the third conductive bonding member 53 due to a stress caused by a difference in thermal expansion coefficients of the circuit element 8 and the substrate 2 can be prevented. Therefore, the circuit element 8 can be guaranteed to be electrically coupled to the substrate 2 for a long period of time, so that the sensor module 1 can be stable in function and enhanced in reliability.

In the present embodiment, although Sn-3.0Ag-0.8Cu-3.0Bi-0.02Ni is used as the second conductive bonding member 52 and the third conductive bonding member 53, the present disclosure is not limited thereto, and a solder other than Sn-3.0Ag-0.8Cu-3.0Bi-0.02Ni may be used. Specifically, the solders used as the second conductive bonding member 52 and the third conductive bonding member 53 may be solders respectively having a second melting point and a third melting point each lower than the first melting point while having a second Young's modulus and a third Young's modulus each higher than the first Young's modulus.

Examples of the solder other than Sn-3.0Ag-0.8Cu-3.0Bi-0.02Ni include Sn-3.0Ag-3.0Bi-3.0In, Sn-3.9Ag-0.6Cu-3.0Sb, Sn-3.8Ag-0.7Cu-3.0Bi-1.4Sb-0.15Ni, and the like. Sn-3.0Ag-3.0Bi-3.0In has a melting point of 198° C. and a Young's modulus of 47.7 GPa. Sn-3.9Ag-0.6Cu-3.0Sb has a melting point of 221° C. and a Young's modulus of 50.1 GPa. Sn-3.8Ag-0.7Cu-3.0Bi-1.4Sb-0.15Ni has a melting point of 207° C. and a Young's modulus of 53.0 GPa.

Further, solders respectively having a second Young's modulus and a third Young's modulus of 50 GPa or more may be used as the second conductive bonding member 52 and the third conductive bonding member 53. In the present embodiment, the lead-free solder is used as the second conductive bonding member 52 and the third conductive bonding member 53, but a lead-containing solder may also be used.

In the present embodiment, the solder used for the second conductive bonding member 52 and the solder used for the third conductive bonding member 53 have the same composition, but may also have different compositions. In other words, the second melting point and the third melting point may be different from each other, and the second Young's modulus and the third Young's modulus may be different from each other. When the second melting point and the third melting point are to be set different from each other, the third melting point may be higher than the second melting point when the substrate 2 is to be first bonded to the circuit element 8 and then to the inertial sensor 3; conversely, the second melting point may be higher than the third melting point when the substrate 2 is to be first bonded to the inertial sensor 3 and then to the circuit element 8.

Figure 5:
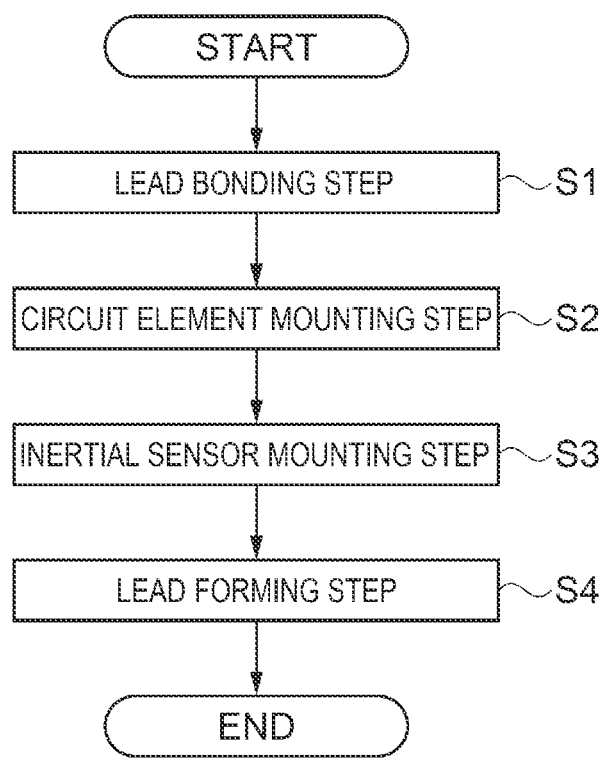
FIG. 5 is a flowchart illustrating a main manufacturing process of the sensor module according to the first embodiment.

Next, a manufacturing method of the sensor module 1 will be described with reference to FIGS. 5 to 9. As shown in FIG. 5, the manufacturing method of the sensor module 1 includes a lead bonding step, a circuit element mounting step, an inertial sensor mounting step, and a lead forming step.

1.1 Lead Bonding Step

Figure 6:
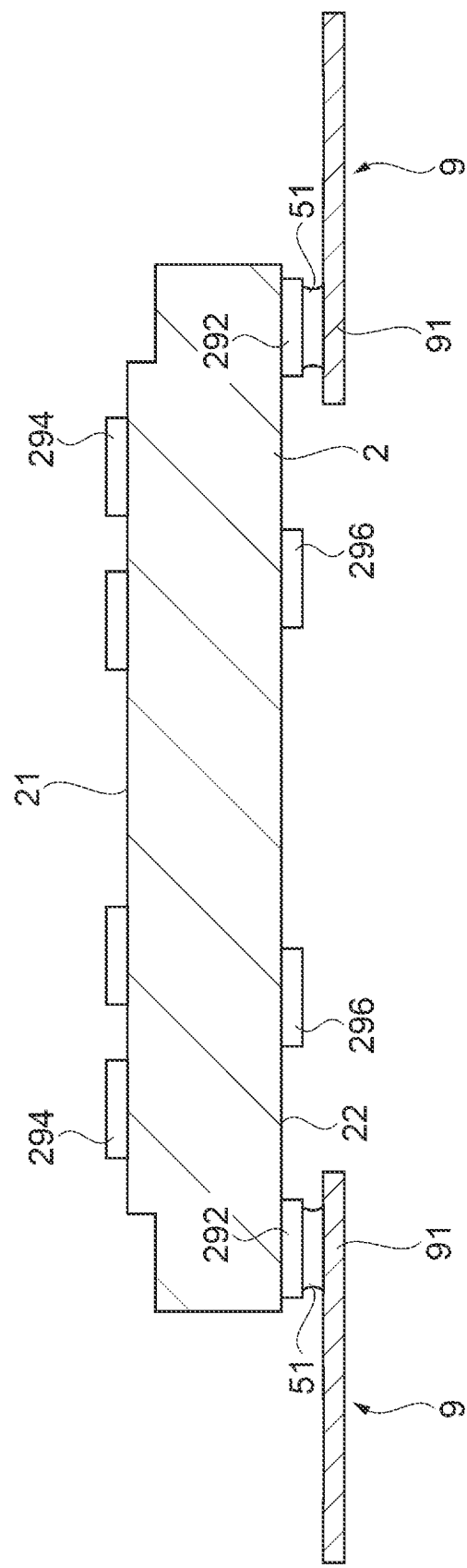
FIG. 6 is a cross-sectional schematic view illustrating a manufacturing step of the sensor module according to the first embodiment.

As shown in FIG. 6, the first terminals 292 provided at the second surface 22 of the substrate 2 are bonded to the coupling portions 91 of the lead 9 via the first conductive bonding members 51 in step S1. A method for bonding the first terminals 292 and the coupling portions 91 of the lead 9 via the first conductive bonding members 51 may be, for example, reflow soldering.

First, the lead 9 and the substrate 2, in which the second terminals 294 are provided at the first surface 21 while the first terminals 292 and the third terminals 296 are provided at the second surface 22, are prepared. In the present embodiment, the lead 9 prepared in step S1 is a plate-shaped lead frame having a frame body (not shown).

Next, the first conductive bonding members 51 are applied to the coupling portions 91 of the lead 9. A method for applying the first conductive bonding member 51 can be performed by, for example, applying a paste obtained by dispersing powder of the first conductive bonding members 51 in a flux.

Then, in a state where the coupling portions 91 applied with the first conductive bonding member 51 and the first terminals 292 are brought into contact with each other via the first conductive bonding members 51, the first conductive bonding members 51 are melted by heating in a reflow furnace. Thus, the lead 9 can be bonded to the first terminals 292 via the first conductive bonding members 51.

In the present embodiment, the first conductive bonding members 51 are applied to the coupling portions 91 of the lead 9, but may also be applied to the first terminals 292.

1.2 Circuit Element Mounting Step

Figure 7:
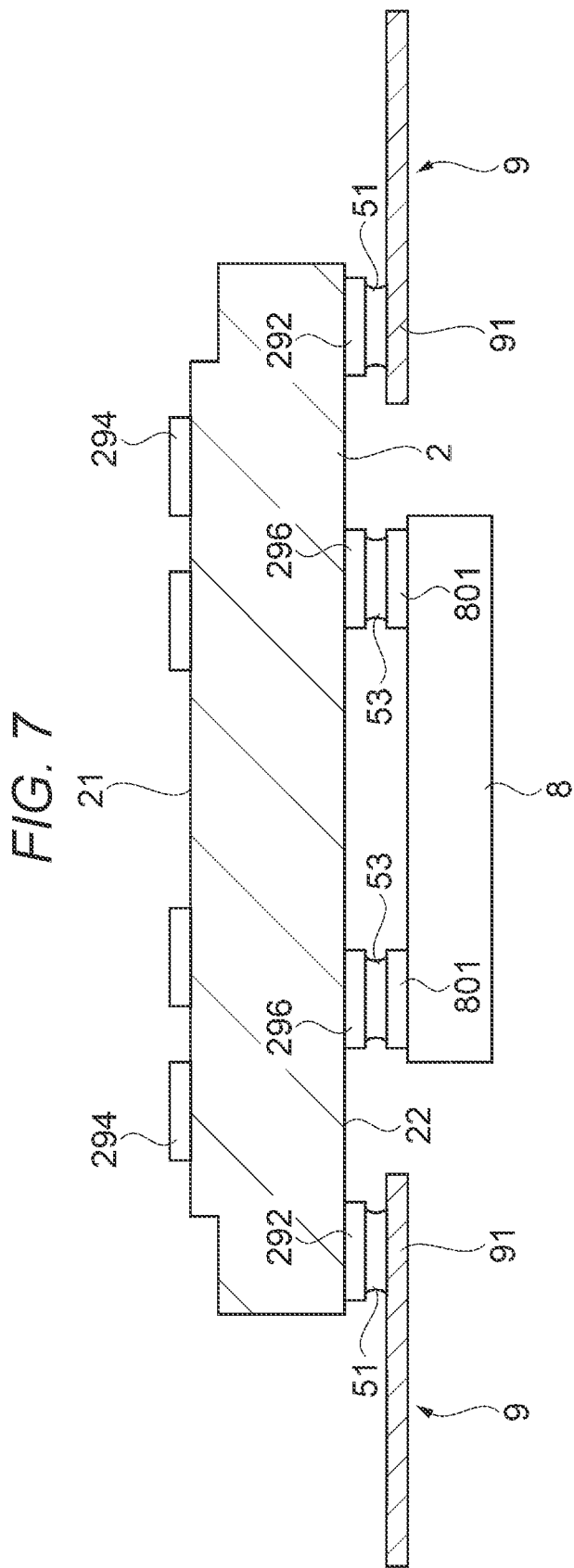
FIG. 7 is a cross-sectional schematic view illustrating a manufacturing step of the sensor module according to the first embodiment.

As shown in FIG. 7, the third terminals 296 provided at the second surface 22 of the substrate 2 are bonded to the coupling terminals 801 provided at the circuit element 8 via the third conductive bonding members 53 in step S2. A method for bonding the third terminals 296 and the circuit element 8 via the third conductive bonding members 53 may be, for example, reflow soldering.

As described above, since the third conductive bonding members 53 have a third melting point lower than the first melting point of the first conductive bonding members 51, the remelting of the first conductive bonding members 51 can be prevented by setting a temperature in the reflow furnace to be higher than the third melting point and lower than the first melting point in step S2. Thus, a bonding failure between the substrate 2 and the lead 9 due to the remelting of the first conductive bonding members 51 is less likely to occur, and a manufacturing yield of the sensor module 1 can be improved.

1.3 Inertial Sensor Mounting Step

Figure 8:
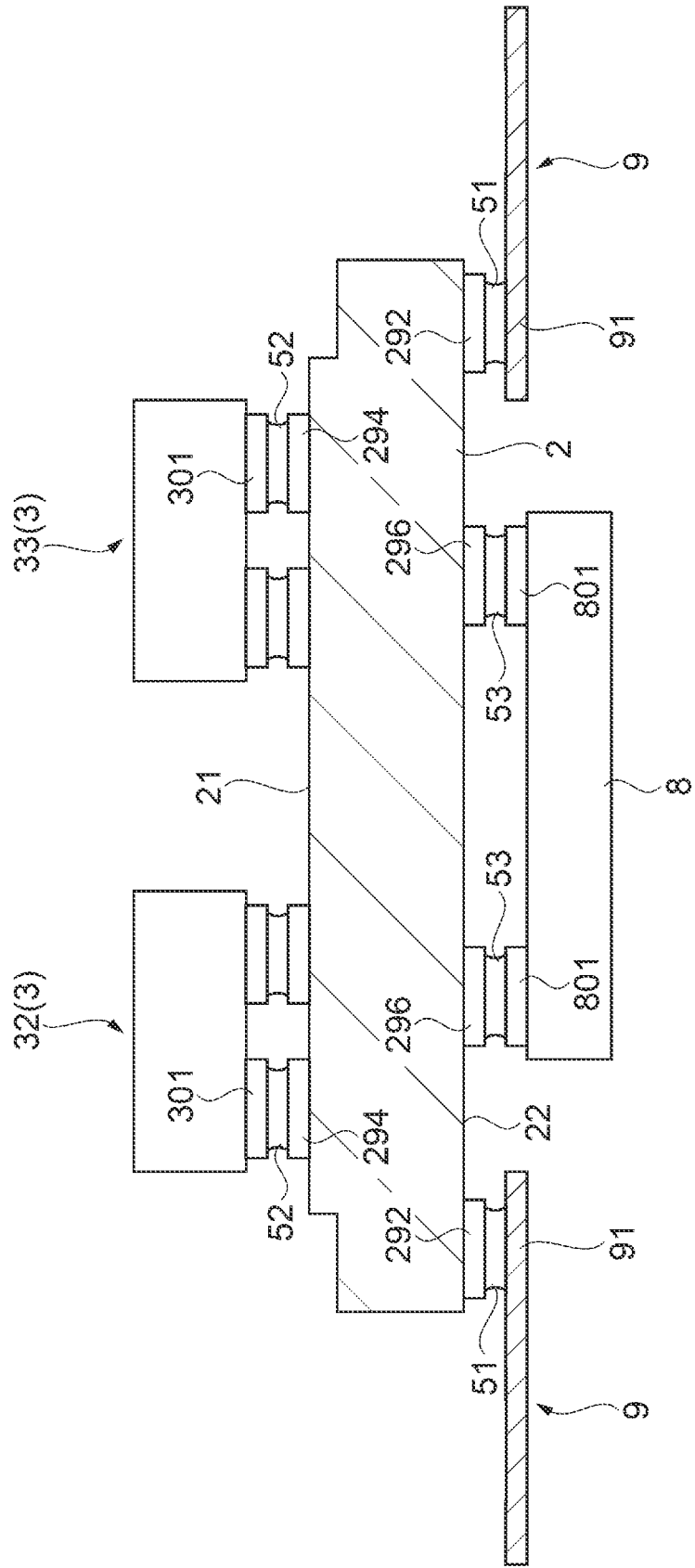
FIG. 8 is a cross-sectional schematic view illustrating a manufacturing step of the sensor module according to the first embodiment.

As shown in FIG. 8, the second terminals 294 provided at the first surface 21 of the substrate 2 are bonded to the coupling terminals 301 provided at the inertial sensor 3 via the second conductive bonding members 52 in step S3. A method for bonding the second terminals 294 and the inertial sensor 3 via the second conductive bonding members 52 may be, for example, reflow soldering.

As described above, since the second conductive bonding members 52 have a second melting point lower than the first melting point of the first conductive bonding members 51, the remelting of the first conductive bonding members 51 can be prevented by setting the temperature in the reflow furnace to be higher than the second melting point and lower than the first melting point in step S3. Thus, a bonding failure between the substrate 2 and the lead due to the remelting of the first conductive bonding member 51 is less likely to occur, and a manufacturing yield of the sensor module 1 can be improved.

1.4 Lead Forming Step

Figure 9:
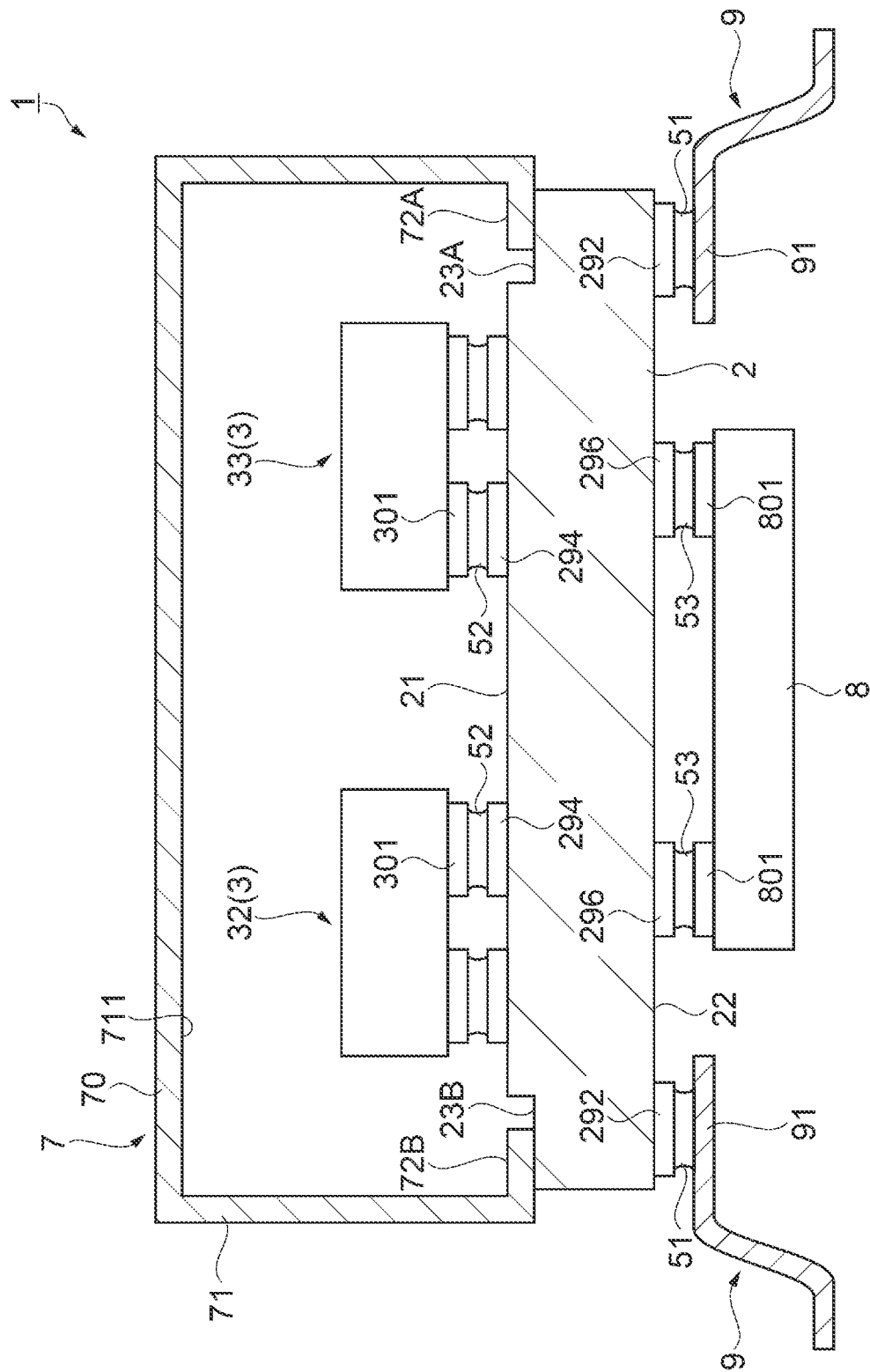
FIG. 9 is a cross-sectional schematic view illustrating a manufacturing step of the sensor module according to the first embodiment.

As shown in FIG. 9, the lead 9 is processed into a desired shape in step S4.

First, the frame body (not shown) of the lead frame is cut out from the lead frame, and the lead 9 is bent and processed into the desired shape. In the present embodiment, the lead 9 is processed to have a so-called gull-wing shape.

Next, the cap 7 is bonded to the first surface 21 of the substrate 2 via bonding members (not shown). In the present embodiment, the cap 7 is bonded to the substrate 2 after the lead 9 is processed into the desired shape, but the lead 9 may also be processed into the desired shape after the cap 7 is bonded to the substrate 2.

The sensor module 1 can be manufactured by a manufacturing process described above.

As described above, according to the present embodiment, following effects can be obtained.

The sensor module 1 includes the first conductive bonding members 51 having the first melting point and the first Young's modulus, and bonding the lead 9 and the first terminals 292 provided at the substrate 2, and the second conductive bonding members 52 having the second melting point lower than the first melting point and the second Young's modulus higher than the first Young's modulus, and bonding the inertial sensor 3 and the second terminals 294 provided at the substrate 2. In this manner, by setting the second Young's modulus of the second conductive bonding members 52 to be higher than the first Young's modulus of the first conductive bonding members 51, deterioration of the second conductive bonding members 52 due to the stress caused by the difference in thermal expansion coefficients of the inertial sensor 3 and the substrate 2 can be prevented. Therefore, the inertial sensor 3 can be guaranteed to be electrically coupled to the substrate 2 for a long period of time, so that the sensor module 1 can be stable in function and enhanced in reliability.

In addition, by setting the second melting point of the second conductive bonding member 52 to be lower than the first melting point of the first conductive bonding member 51, when the substrate 2 and the lead 9 are first bonded by the first conductive bonding member 51 and then the substrate 2 and the inertial sensor 3 are bonded by the second conductive bonding member 52, the remelting of the first conductive bonding member 51 during bonding by the second conductive bonding member 52 is prevented. Thus, the bonding failure between the substrate 2 and the lead 9 due to the remelting of the first conductive bonding member 51 is less likely to occur, and a manufacturing yield of the sensor module 1 can be improved.

2. Second Embodiment

Next, a sensor module 1a according to the second embodiment will be described with reference to FIGS. 10 and 11. In the following description, differences from the first embodiment described above will be mainly described, the same reference numerals are given to the same configuration as the first embodiment, and redundant description will be omitted.

The sensor module 1a according to the present embodiment is different from the first embodiment in that the first surface 21 of the substrate 2 is provided with first terminals 292a.

As shown in FIG. 10, the first terminals 292a are provided at the first surface 21 as the upper surface of the substrate 2, and each first terminal 292a and each coupling portion 91a of a lead 9a overlap each other when viewed from the top in the Z direction.

Figure 11:
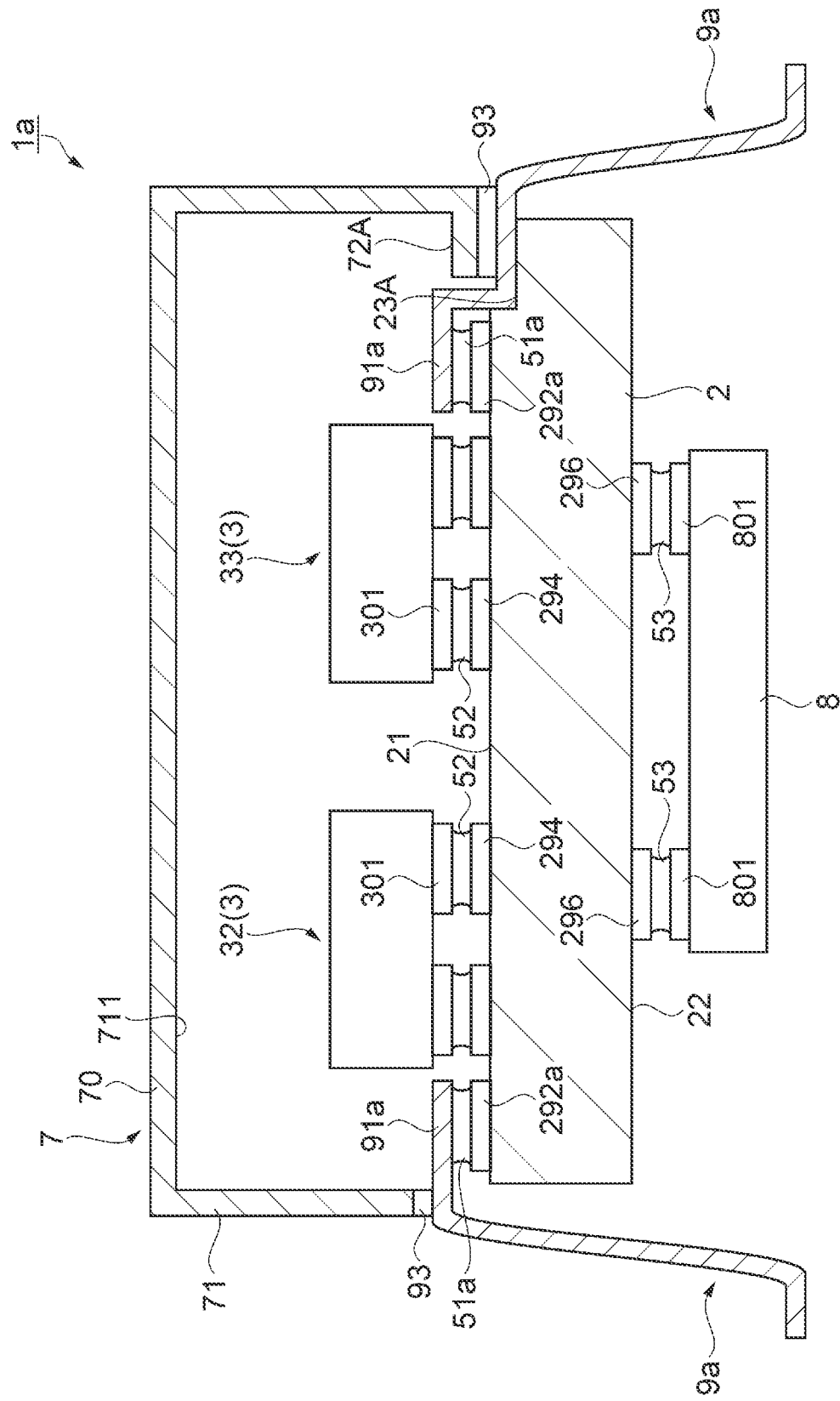
FIG. 11 is a cross-sectional view taken along a line B-B in FIG. 10.

As shown in FIG. 11, the first terminals 292a provided at the first surface 21 of the substrate 2 are bonded to the coupling portions 91a of the lead 9a via first conductive bonding members 51a. In the first concave portion 23A of the substrate 2, the lead 9a has a shape bent along a side surface and a bottom surface of the first concave portion 23A. Although not illustrated, in the second concave portion 23B, the third concave portion 23C, and the fourth concave portion 23D of the substrate 2, the lead 9a also has a shape bent along side surfaces and bottom surfaces of the respective concave portions 23B, 23C, and 23D similar to the first concave portion 23A.

An insulating film 93 is provided at an upper surface of the lead 9a, which is a surface of the lead 9a facing a lower end portion of the side wall 71 of the cap 7. By providing the insulating film 93 between the cap 7 and the lead 9a, a short circuit due to contact between the cap 7 and the lead 9a can be prevented. The insulating film 93 can be formed of, for example, an insulating resin such as a polyimide resin, an epoxy resin or the like. The short circuit due to contact between the cap 7 and the lead 9a may also be prevented by separating the lower end portion of the side wall 71 of the cap 7 from the upper surface of the lead 9a.

In the present embodiment, similarly to the first embodiment, Sn-5.0Sb is used as the first conductive bonding member 51a, and Sn-3.0Ag-0.8Cu-3.0Bi-0.02Ni is used as the second conductive bonding member 52 and the third conductive bonding member 53. Thus, similarly to the first embodiment, the second conductive bonding member 52 has a second melting point lower than a first melting point of the first conductive bonding member 51a and a second Young's modulus higher than a first Young's modulus of the first conductive bonding member 51a. Further, the third conductive bonding member 53 has a third melting point lower than the first melting point of the first conductive bonding member 51a and a third Young's modulus higher than the first Young's modulus of the first conductive bonding member 51a.

According to the present embodiment, even when the first terminals 292a are provided at the first surface 21 of the substrate 2, the same effects as in the first embodiment can be obtained.

3. Third Embodiment

Next, a sensor module 1b according to the third embodiment will be described with reference to FIGS. 12 and 13. In the following description, differences from the first embodiment described above will be mainly described, the same reference numerals are given to the same configuration as the first embodiment, and redundant description will be omitted.

The sensor module 1b according to the present embodiment is different from the first embodiment in that the inertial sensor 3 is bonded to the substrate 2 via an insulating bonding member 60. The present embodiment is also different from the first embodiment in that the circuit element 8 is bonded to the substrate 2 via an insulating bonding member 61.

Figure 12:
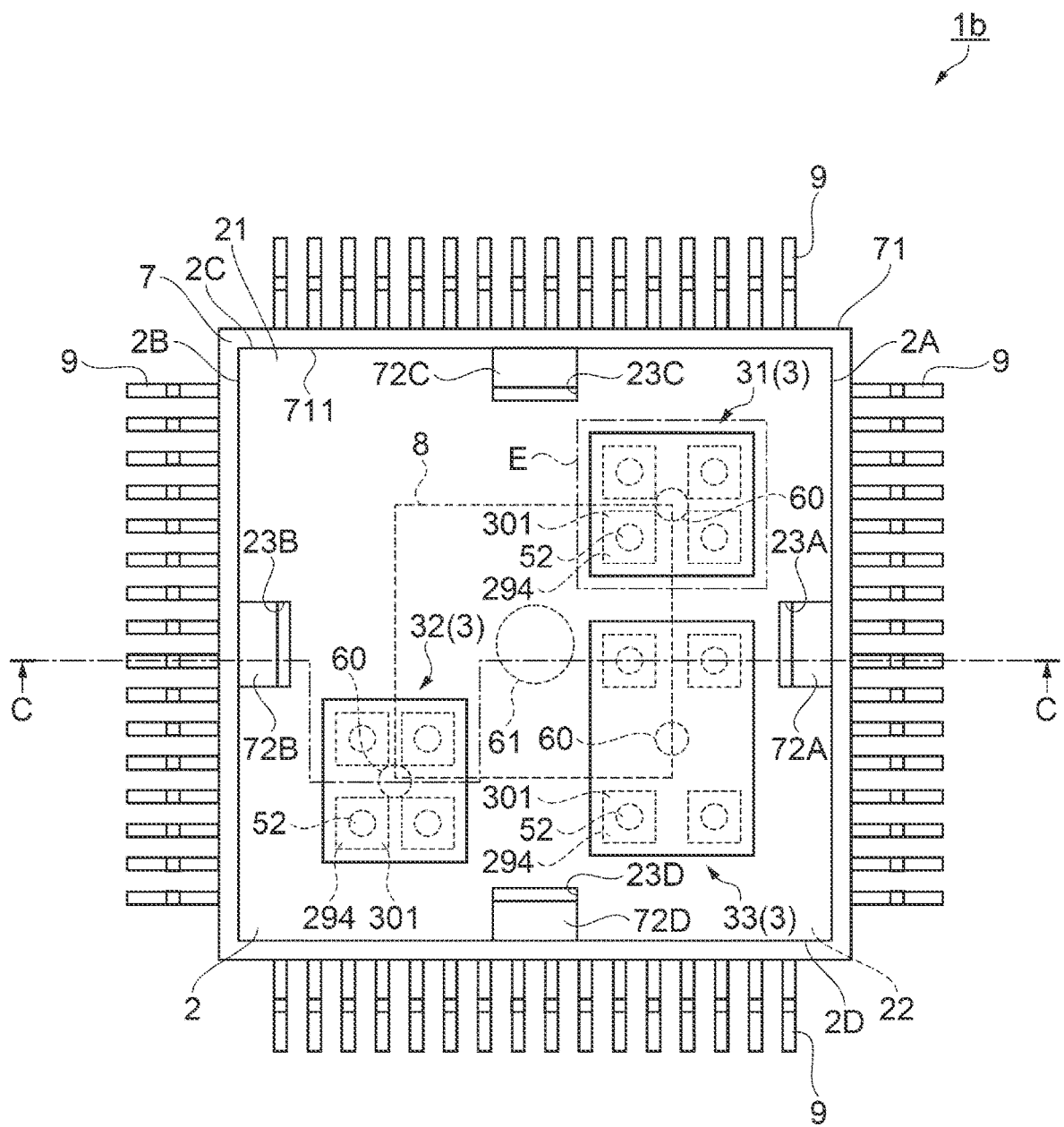
FIG. 12 is a plan view of a sensor module according to a third embodiment.
Figure 13:
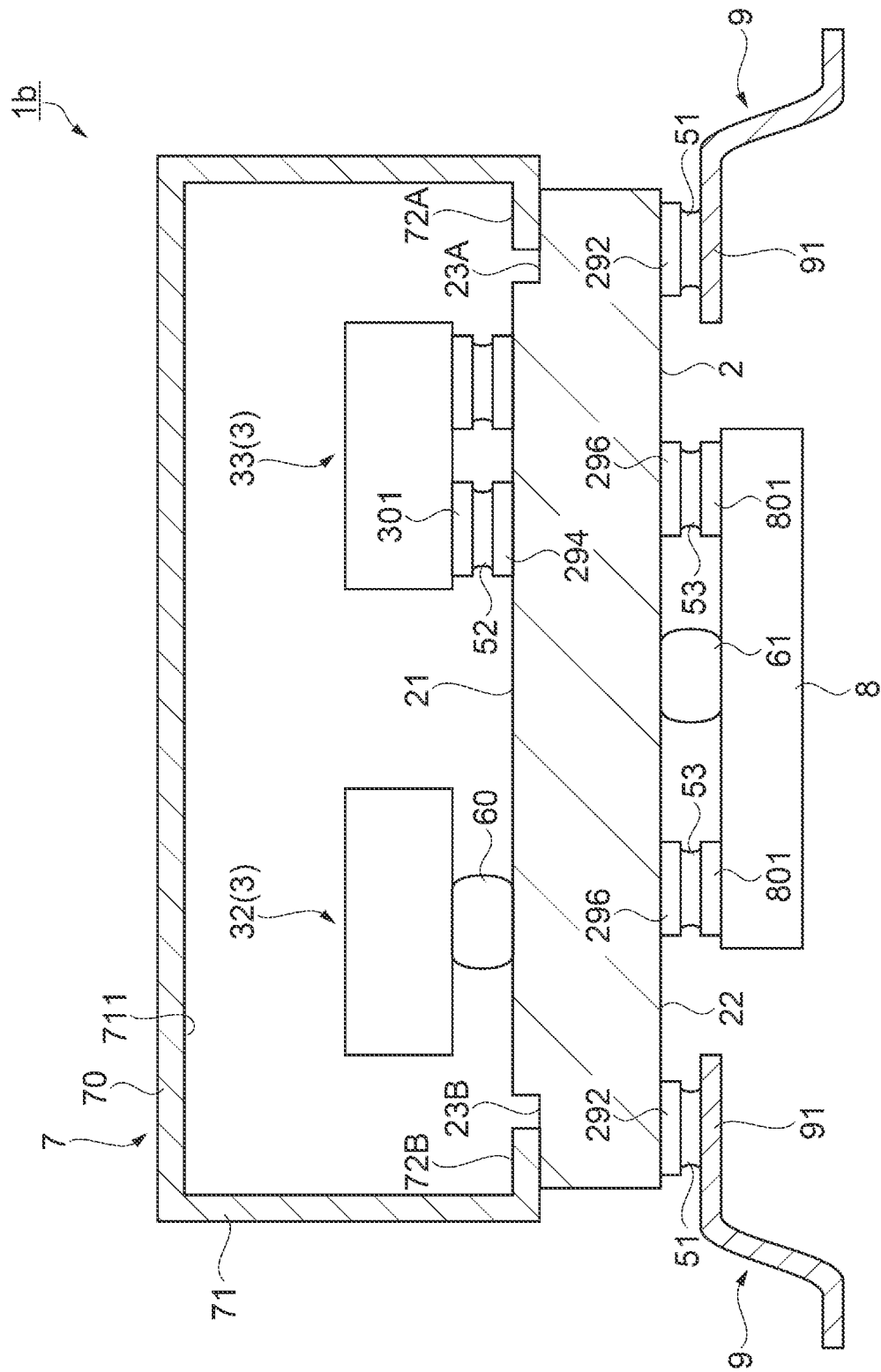
FIG. 13 is a cross-sectional view taken along a line C-C in FIG. 12.

As shown in FIG. 12, when viewed from the top in the Z direction, the insulating bonding member 60 is disposed at a central portion of the lower surface of the inertial sensor 3. As shown in FIG. 13, the lower surface of the inertial sensor 3 is bonded to the first surface 21 as the upper surface of the substrate 2 via the insulating bonding member 60.

The insulating bonding member 60 may be formed of, for example, an adhesive made of a thermosetting resin such as an epoxy resin or a silicone resin. A glass transition temperature of the insulating bonding member 60 may be higher than an upper limit temperature of a temperature range for guaranteeing operation of the sensor module 1b.

When the customer solders the lead 9 and the customer substrate in order to mount the sensor module 1b at the customer substrate, the second conductive bonding members 52 bonding the inertial sensor 3 and the substrate may be remelted. When the second conductive bonding members 52 are remelted, a bonding state between the inertial sensor 3 and the substrate 2 changes. That is, the deviation of the detection axis of the inertial sensor 3, or the like changes from a state before delivery, and detection accuracy of the sensor module 1b decreases. However, by bonding the inertial sensor 3 and the substrate 2 via the insulating bonding member 60, the bonding state between the inertial sensor 3 and the substrate 2 is less likely to change even when the second conductive bonding members 52 are remelted, so that a decrease in the detection accuracy of the sensor module 1b can be prevented.

As shown in FIG. 12, when viewed from the top in the Z direction, the insulating bonding member 61 is disposed at a central portion of the upper surface of the circuit element 8. As shown in FIG. 13, the upper surface of the circuit element 8 is bonded to the second surface 22 as the lower surface of the substrate 2 via the insulating bonding member 61. Similarly to the insulating bonding member 60, the insulating bonding member 61 may be formed of an adhesive made of a thermosetting resin such as an epoxy resin or a silicone resin.

As a method for bonding the substrate 2 to the inertial sensor 3 and the circuit element 8 via the insulating bonding members 60 and 61, for example, the substrate 2 is bonded to the inertial sensor 3 and the circuit element 8 via the second conductive bonding members 52 and the third conductive bonding members 53 respectively, and then the insulating bonding members 60 and 61 in an uncured state can be injected into a gap between the first surface 21 of the substrate 2 and the lower surface of the inertial sensor 3 and a gap between the second surface 22 of the substrate 2 and the upper surface of the circuit element 8 respectively, and the insulating bonding members 60 and 61 after injection can be then thermally cured. However, in this manner, bonding by the second conductive bonding members 52 and bonding by the insulating bonding member 60 may be performed simultaneously, while bonding by the third conductive bonding member 53 and bonding by the insulating bonding member 61 may be performed simultaneously, instead of separately performing bonding by the second conductive bonding member 52 and the third conductive bonding member 53, and bonding by the insulating bonding members 60 and 61.

According to the present embodiment, following effects can be obtained in addition to the effects of the first embodiment.

When the customer mounts the sensor module 1b at the customer substrate by bonding the inertial sensor 3 and the substrate 2 via the insulating bonding member 60, the bonding state between the inertial sensor 3 and the substrate 2 is less likely to change even when the second conductive bonding members 52 are remelted, so that a decrease in the detection accuracy of the sensor module 1b can be prevented.

The sensor modules 1, 1a, and 1b can be applied to, for example, vehicles such as a construction machine and an agricultural machine, moving objects such as a robot and a drone, and electronic devices such as a smartphone and a head-mounted display.

What is claimed is:
1. A sensor module, comprising:
a substrate, including a first surface and a second surface on front and back sides of each other, an external terminal provided at one of the first surface and the second surface, and an internal terminal provided at the first surface;
a lead bonded to the external terminal and having a gull-wing shape;
a first conductive bonding member having a first melting point and a first Young's modulus, the first conductive bonding member being interposed between the lead and the external terminal, and the first conductive bonding member bonding the lead to the external terminal;
an inertial sensor bonded to the internal terminal, the inertial sensor including a lower surface and a coupling terminal provided at the lower surface, the coupling terminal being configured to input a control signal for controlling the inertial sensor and output a detection signal from the inertial sensor;

a second conductive bonding member having a second melting point lower than the first melting point and a second Young's modulus higher than the first Young's modulus, the second conductive bonding member being interposed between the coupling terminal and the internal terminal, and the second conductive bonding member bonding the coupling terminal to the internal terminal so as to bond the inertial sensor to the internal terminal; and a cap bonded to the first surface of the substrate so that side walls of the cap, a top plate of the cap extending between distal ends of the side walls, and the first surface of the substrate define an enclosed housing area, wherein the inertial sensor, the coupling terminal, the internal terminal, and the second conductive bonding member are provided on the first surface of the substrate and disposed within the housing area so as to be housed between the cap and the first surface of the substrate, and wherein the external terminal, the lead, and the first conductive bonding member are disposed outside of the housing area.

2. The sensor module according to claim 1, further comprising:

a second internal terminal provided at the second surface of the substrate;

a circuit element bonded to the second internal terminal and configured to process the detection signal output from the inertial sensor; and a third conductive bonding member having a third melting point lower than the first melting point and a third Young's modulus higher than the first Young's modulus, the third conductive bonding member being interposed between the circuit element and the second internal terminal, and the third conductive bonding member bonding the circuit element to the second internal terminal, wherein the second internal terminal, the circuit element, and the third conductive bonding member are disposed outside of the housing area.

3. The sensor module according to claim 1, further comprising:

an insulating bonding member bonding the inertial sensor and the first surface of the substrate.

4. The sensor module according to claim 1, wherein the external terminal is provided at the second surface of the substrate, the cap further includes convex portions respectively projecting from each of the side walls of the cap toward the opposed side wall of the cap, wherein lower surfaces of the convex portions facing away from the top plate of the cap are bonded to the first surface of the substrate, and the second surface of the substrate, the external terminal, the lead, and the first conductive bonding member are disposed outside the housing area.

5. The sensor module according to claim 4, wherein the housing area is an only area housed between the cap and the substrate.

6. The sensor module according to claim 1, wherein the housing area is an only area housed between the cap and the substrate.

7. A sensor module, comprising:

a substrate including an external terminal and an internal terminal;

a first conductive bonding member having a first melting point and a first Young's modulus;

a lead bonded to the external terminal by the first conductive bonding member, the first conductive bonding member being interposed between the lead and the external terminal;

a second conductive bonding member having a second melting point lower than the first melting point and a second Young's modulus higher than the first Young's modulus;

an inertial sensor including a coupling terminal, the coupling terminal being bonded to the internal terminal by the second conductive bonding member, the second conductive bonding member being interposed between the coupling terminal and the internal terminal; and a cap bonded to the substrate and housing, in an enclosed housing area between the cap and the substrate, the inertial sensor, the coupling terminal, the internal terminal, and the second conductive bonding member, the housing area being an only area housed between the cap and the substrate, wherein the coupling terminal inputs a control signal for controlling the inertial sensor, and outputs a detection signal from the inertial sensor, and the external terminal, the lead, and the first conductive bonding member are disposed outside of the housing area between the cap and a first surface of the substrate.

* * * * *